(12) United States Patent  
Miyaba

(10) Patent No.: US 7,808,280 B2  
(45) Date of Patent: Oct. 5, 2010

(54) SEMICONDUCTOR DEVICE

(75) Inventor: Takeshi Miyaba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/472,744

(22) Filed: May 27, 2009

(65) Prior Publication Data

US 2009/0230995 A1 Sep. 17, 2009

(30) Foreign Application Priority Data

May 28, 2005 (JP) ............................. 2008-139823

(51) Int. Cl.
*H01L 25/00* (2006.01)
(52) U.S. Cl. ............................ 326/101; 326/41; 326/47
(58) Field of Classification Search ............. 326/38–41, 326/47, 101
See application file for complete search history.

(56) References Cited

U.S. PATENT DOCUMENTS 7,295,036 B1 * 11/2007 Zaveri et al. .................. 326/38

FOREIGN PATENT DOCUMENTS

| JP | 2006-173478 | 6/2006 |
| JP | 2008-270429 | 11/2008 |

* cited by examiner

*Primary Examiner*—Daniel D Chang
(74) *Attorney, Agent, or Firm*—Oblon, Spivak, McClelland, Maier & Neustadt, L.L.P.

(57) ABSTRACT

A semiconductor device includes multiple functional blocks, each having a predetermined function, and wiring regions on a substrate where a signal line is provided. The semiconductor device also includes multiple standard cells disposed in the wiring regions along the signal line, each of which operates with a substrate bias potential, and multiple contact cells disposed in the wiring region in parallel with the wiring direction of the signal line, each being associated with each of the multiple standard cells and providing the substrate bias potential to the associated standard cell.

18 Claims, 7 Drawing Sheets

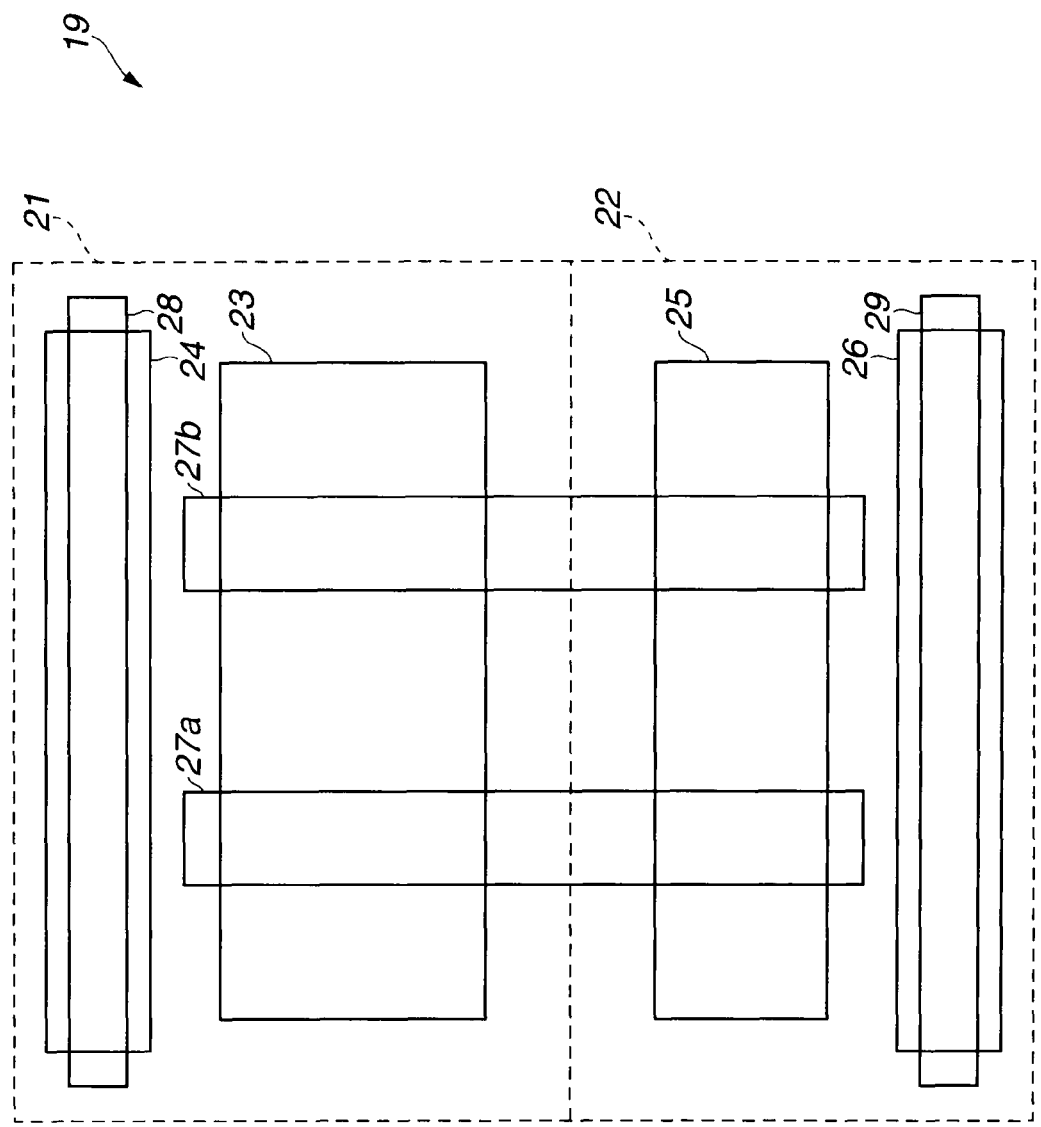

SEMICONDUCTOR DEVICE

CROSS REFERENCE TO RELATED APPLICATION

This application is based upon and claims the benefit of priority from the prior Japanese Patent Application No. 2008-139823 filed in Japan on May 28, 2008; the entire contents of which are incorporated herein by reference.

BACKGROUND OF THE INVENTION

1. Field of the Invention

The present invention relates to a semiconductor device and, in particular, to a semiconductor device having substrate bias control capability.

2. Description of the Related Art

As the scale of integration of semiconductor integrated circuits has increased, standard-cell-based layout design has been made in which a cell library of standard cells, which are logic circuits such as inverter circuits and buffer circuits, is created and used. In order to increase the speed of operation of semiconductor integrated circuits and to control leakage current, substrate bias control is used which controls the source potential of a transistor and substrate potential, that is, the potential of a well region, are controlled by using separate power supplies. The potential required for the substrate bias control is called substrate bias potential. Increasing the substrate bias potential increases the threshold voltage, and therefore leakage current and power consumption can be reduced. Decreasing the substrate bias potential decreases the threshold voltage, and therefore the speed of operation of transistors can be increased.

The substrate bias potential is provided through a substrate bias control line provided separately from an ordinary power supply line. Accordingly, standard cells to which substrate bias control is applied requires terminals and lines for providing the substrate bias potential to the standard cells, while power consumption is reduced due to reduction in leakage current and operation speed can be increased. Therefore, a problem with standard cells to which substrate bias control is applied arises in footprint.

In order to solve the problem, a semiconductor integrated circuit has been proposed which is provided with standard cells without terminals and lines for providing substrate bias and spacer cells or filler cells for keeping a well potential at a fixed level. The standard cells are disposed first and then the spacer cells or filler cells are disposed in unoccupied regions for keeping the substrate bias potential of well regions of the standard cells without substrate bias terminals and lines at a fixed level (see for example Japanese Patent Application Laid-Open No. 2006-173478).

In a semiconductor integrated circuit, signal lines are densely provided in narrow regions between an input/output unit and functional block and between functional blocks for passing signals from a core logic unit to the input/output unit. In addition, standard cells included in circuitry constituting a random logic are disposed in the narrow regions.

That is, standard cells such as buffer circuits also called repeaters that function as elements for shaping signal waveforms distorted by transmission over a long-distance line are also disposed in the narrow regions. Such standard cells are disposed only in locations in the narrow regions where the cells are needed and the density of the standard cells is low as compared with standard cells provided in a core logic unit, for example. If spacer cells or filler cells are disposed in the unoccupied space between the sparsely disposed standard cells as in the above semiconductor integrated circuit proposed, the density of spacer of filler cells will be so high that space for disposing signal lines cannot be provided.

BRIEF SUMMARY OF THE INVENTION

According to one aspect of the present invention, there is provided a semiconductor device having substrate bias control capability, including: a plurality of functional blocks formed on a substrate, each having a predetermined function; a wiring region between functional blocks, a wiring region between each of the functional block and an input/output unit, and a wiring region between each of the functional blocks and a core logic unit on the substrate, in each of which a signal line is provided; a plurality of logic circuits formed on the substrate, disposed in the wiring regions, and provided along the signal line, each of the plurality of logic circuits operating with a substrate bias potential; and a plurality of contact sections formed on the substrate, disposed in the wiring regions in parallel with a wiring direction of the signal line, each being associated with each of the plurality of logic circuits for providing the substrate bias potential to the associated logic circuit.

BRIEF DESCRIPTION OF THE DRAWINGS

FIG. 7 is plan view illustrating an exemplary structure of a filler cell.

DETAILED DESCRIPTION OF THE EMBODIMENTS OF THE INVENTION

Embodiments of the present invention will be described below with reference to the accompanying drawings.

First Embodiment

Figure 1:
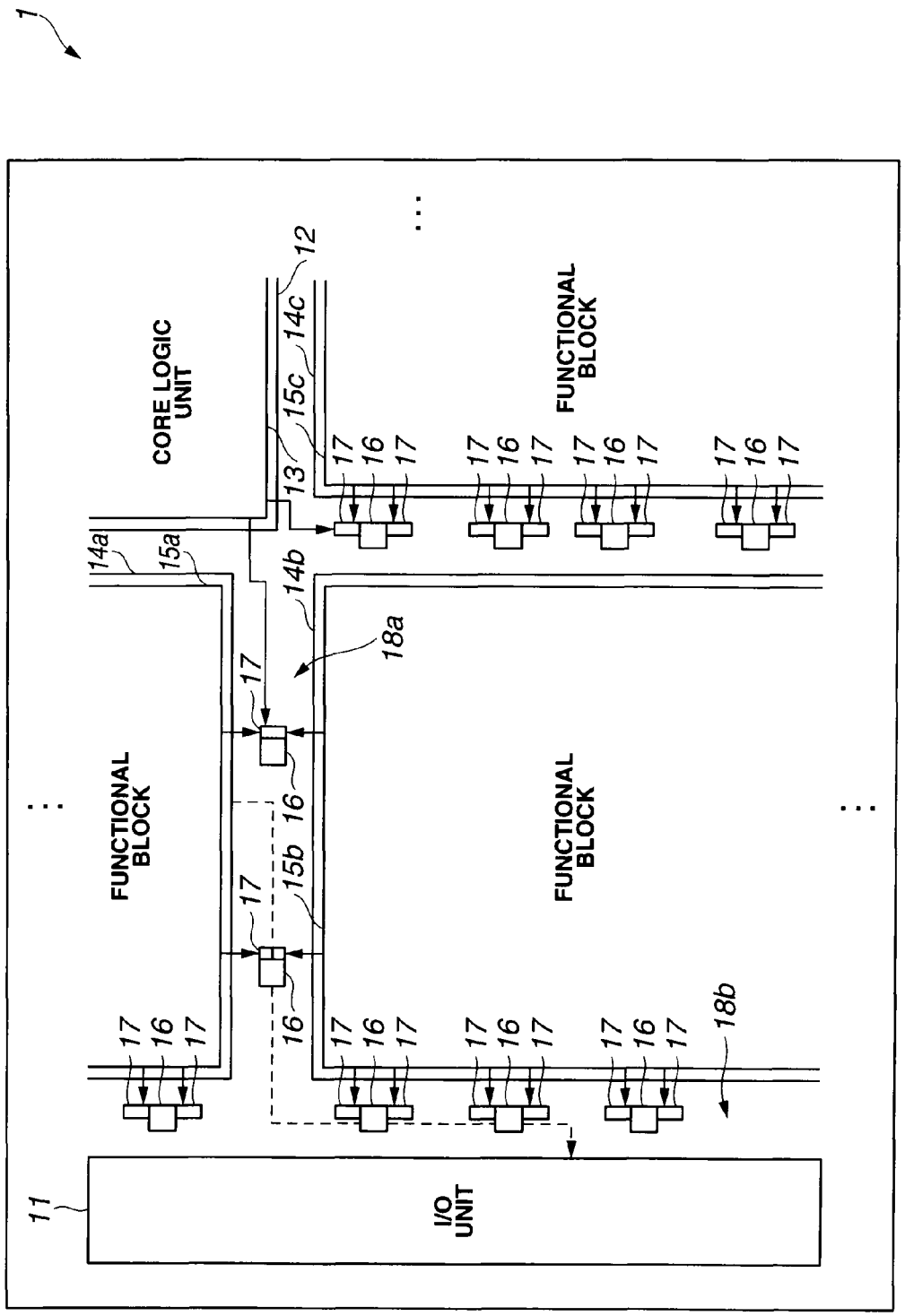
FIG. 1 is a plan view of a semiconductor apparatus according to a first embodiment.

FIG. 1 is a plan view of a semiconductor device according to a first embodiment. As shown in FIG. 1, the semiconductor device 1 according to the present embodiment includes an input/output (hereinafter abbreviated as I/O) unit 11, a core logic unit 12, and multiple functional blocks 14a to 14c and is configured as a single semiconductor chip. The semiconductor device 1 is of a substrate-isolation type, that is, a semiconductor device in which the source potential of a transistor and the potential of a well region are controlled by separate power sources. The core logic unit 12 had a substrate bias line 13 for controlling substrate bias. The functional blocks 14a, 14b and 14c have substrate bias lines 15a, 15b and 15c, respectively, for controlling the substrate bias. The functional blocks 14a to 14c have predetermined functions. For example, the functional blocks 14a to 14c may be elements such as an SRAM, an analog-digital converter, and a PLL (Phase Locked Loop).

Multiple standard cells 16 and substrate contact cells 17 associated with the standard cells 16 disposed in narrow regions between the I/O unit 11 and functional block 14a, between the I/O unit 11 and functional block 14b, between functional blocks 14a and 14b, and between functional blocks 14b and 14c. A substrate contact cell or cells 17 for providing a substrate bias potential to its associated standard cell 16 disposed in the narrow region are disposed contiguously to the standard cell 16. While it is assumed in the present embodiment that the standard cells 16 are buffer circuits, the standard cells 16 are not limited to buffer circuits. The standard cells 16 may be other logic circuits such as inverter, AND, or OR circuits. In the following description, the region between the I/O unit 11 and functional block 14a and the region between the I/O unit 11 and functional block 14b are sometimes simply referred to as the region between I/O unit and functional block. Similarly, the region between functional blocks 14a and 14b and the region between functional blocks 14b and 14c are sometime simply referred to as the region between functional blocks.

The narrow regions described above constitute wiring regions 18a, 18b in which signal lines are densely provided through which signals pass from the core logic unit 12 to the I/O unit 11 or from functional block 14a to the I/O unit 11, for example. For example, the dashed arrow in FIG. 1 represents a signal line from functional block 14a to the I/O unit 11. Buffer circuits called repeaters for shaping a signal waveform distorted by transmission over a long-distance, that is standard cells 16, are disposed along the signal line. In order to provide the substrate bias potential to the standard cells 16, one or two substrate contact cells 17 are disposed contiguously to each standard cell 16 in the direction parallel to the wiring direction of the signal line.

All standard cells 16 and substrate contact cells 17 are disposed in predetermined directions. When a standard cell 16 and a contact cell 17 are to be disposed contiguously to each other in the wiring region 18a where the signal line is disposed horizontally, one substrate contact cell 17 is disposed at one of both ends of the standard cell 16, that is, one of the right and left ends of the standard cell, as shown in FIG. 1. On the other hand, when a standard cell 16 and a substrate contact cell 17 are to be disposed contiguously to each other in the wiring region 18b where the signal line is disposed in the vertical direction orthogonal to the horizontal wiring direction, one substrate contact cell 17 is disposed at each of both ends of the standard cell 16, that is, at each of the upper and lower ends of the standard cell 16. That is, two substrate contact cells 17 are disposed contiguously to the standard cell 16.

Placement of substrate contact cells 17 at each of the upper and lower ends of a standard cell 16 in the wiring region 18b where the signal line is disposed vertically can reduce the distance between the I/O unit 11 and functional block 14a and the distance between functional blocks 14b and 14c as compared placement of a substrate contact cell 17 at one of the right and left ends of the standard cell 16. That is, placement of substrate contact cells 17 at both ends of a standard cell 16 in the vertical direction has the effect of reducing the footprint of the semiconductor device 1.

A substrate bias line is directly connected to substrate contact cells 17 disposed in the wiring regions 18a, 18b from substrate bias line 13 around the core logic unit 12, a substrate bias line 15a, 15b, or 15c around a functional 14a, 14b, or 14c.

Figure 2:
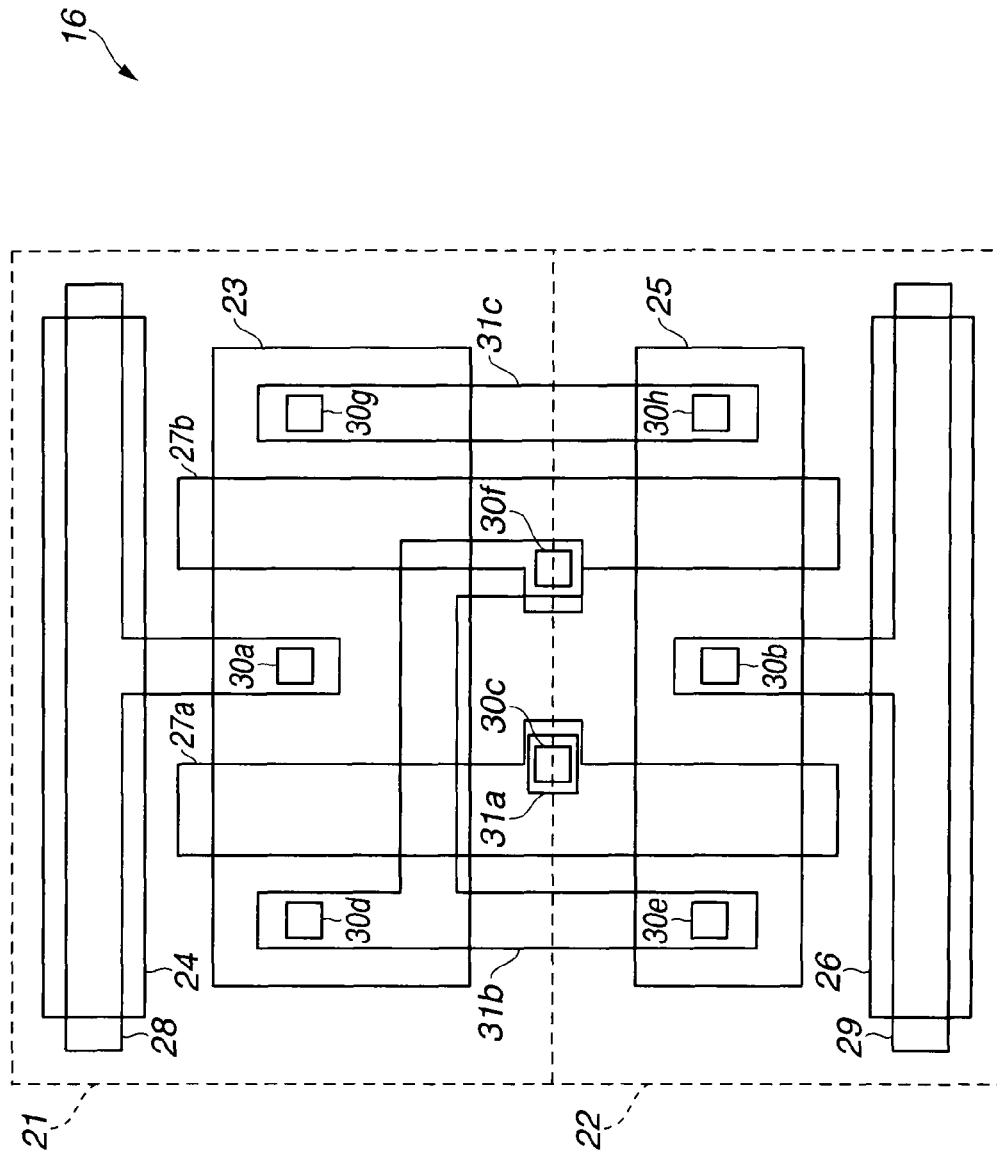
FIG. 2 is a plan view illustrating an exemplary structure of a standard cell.

FIG. 2 is a plan view illustrating an exemplary structure of a standard cell. The standard cell 16 shown in FIG. 2 is one typical standard cell and is a buffer circuit capable of controlling a substrate bias potential.

As shown in FIG. 2, the standard cell 16 has an N-well 21 and a P-well 22 formed and structured on a semiconductor substrate. A diffusion layer 23 of a PMOS transistor and an N-well guard ring 24 are formed in the N-well 21. A diffusion layer 25 of an NMOS transistor and a P-well guard ring 26 are formed in the P-well 22.

Gates 27a and 27b are formed above the diffusion layer 23 of the PMOS transistor and the diffusion layer 25 of the NMOS transistor, respectively.

A power supply line 28 is formed above the N-well guard ring 24 and a ground line 29 is formed on the P-well guard ring 26.

The power supply line 28 is connected to the diffusion layer 23 of the PMOS transistor through a contact 10a. The ground line 29 is connected to the diffusion layer 25 of the NMOS transistor through a contact 30b.

A wiring layer 31a is formed above the gate 27a. The wiring layer 31a is connected to the gate 27a through a contact 30c. The wiring layer 31a acts as an input terminal of the standard cell 16.

A wiring layer 31b is connected to the diffusion layer 23 of the PMOS transistor and the diffusion layer 25 of the NMOS transistor through contacts 30d and 30e respectively and to the gate 27b through a contact 30f.

A wiring layer 31c is connected to the diffusion layer 23 of the PMOS transistor and the diffusion layer 25 of the NMOS transistor through contacts 30g and 30h, respectively. The wiring layer 31c acts an output terminal of the standard cell 16.

In the structure of the standard cell 16 capable of controlling the substrate bias potential for the N-well 21 and the P-well 22 described above, the source potential of the transistor and the potentials of the N-well 21 and the P-well 22 are separately controlled and therefore substrate contacts are not provided. The standard cells 16 provided for substrate bias control are electrically isolated because a contact between the power supply line 28 and the N-well guard ring 24 below the power supply line 28 and a contact between the ground line 29 and the P-well guard ring 26 below the ground line 29 are eliminated. The N-well guard ring 24 and the P-well guard ring 26 may be omitted. In that case, gate widths can be increased by an amount equivalent to the area of the N-well guard ring 24 and P-well guard ring 26 eliminated.

Figure 3:
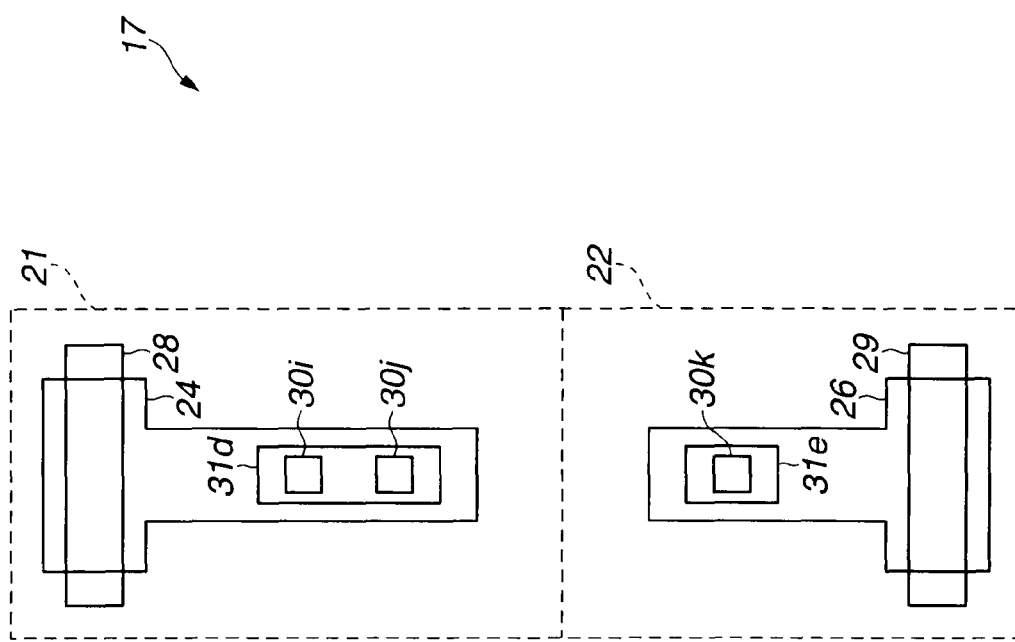
FIG. 3 is a plan view illustrating an exemplary structure of a substrate contact cell.

FIG. 3 is a plan view illustrating an exemplary structure of a substrate contact cell. The substrate contact cell 17 is a contact section for providing a substrate bias potential to each of the N-well 21 and the P-well 22 of a standard cell 16.

As shown in FIG. 3, the substrate contact cell 17 includes an N-well 21 and a P-well 22 formed and structured on a semiconductor substrate.

An N-well guard ring 24 is formed in the N-well 21. A power supply line 28 is formed above the N-well guard ring 24. A P-well guard ring 26 is formed in the P-well 22. A ground line 29 is formed above the P-well guard ring 26.

A wiring layer 31d is formed above the N-well guard ring 24. The wiring layer 31d is connected to the N-well guard ring 24 through contacts 30i and 30j. A wiring layer 31e is formed above the P-well guard ring 26. The wiring layer 31e is connected to the P-well guard ring 26 through a contact 30k.

A substrate bias power supply line from a substrate bias line 13 of the substrate-isolated core logic 12 or a substrate bias line 15a, 15b, or 15c of the substrate-isolated functional block 14a, 14b, or 14c is connected to the wiring layer 31d. This connected provides a substrate bias potential to the N-well guard ring 24 through the contacts 30i and 30j, thereby providing the substrate bias potential to the N-well 21.

A substrate bias ground line form the bias line 13 of the substrate-isolated core logic unit 12 or the substrate bias line 15a, 15b, or 15c of the substrate-isolated functional block 14a, 14b, or 14c is connected to the wiring layer 31e. This connection provides a substrate bias potential to the P-well guard ring 26 through the contact 30k, thereby providing the substrate potential to the P-well 22.

Figure 4:
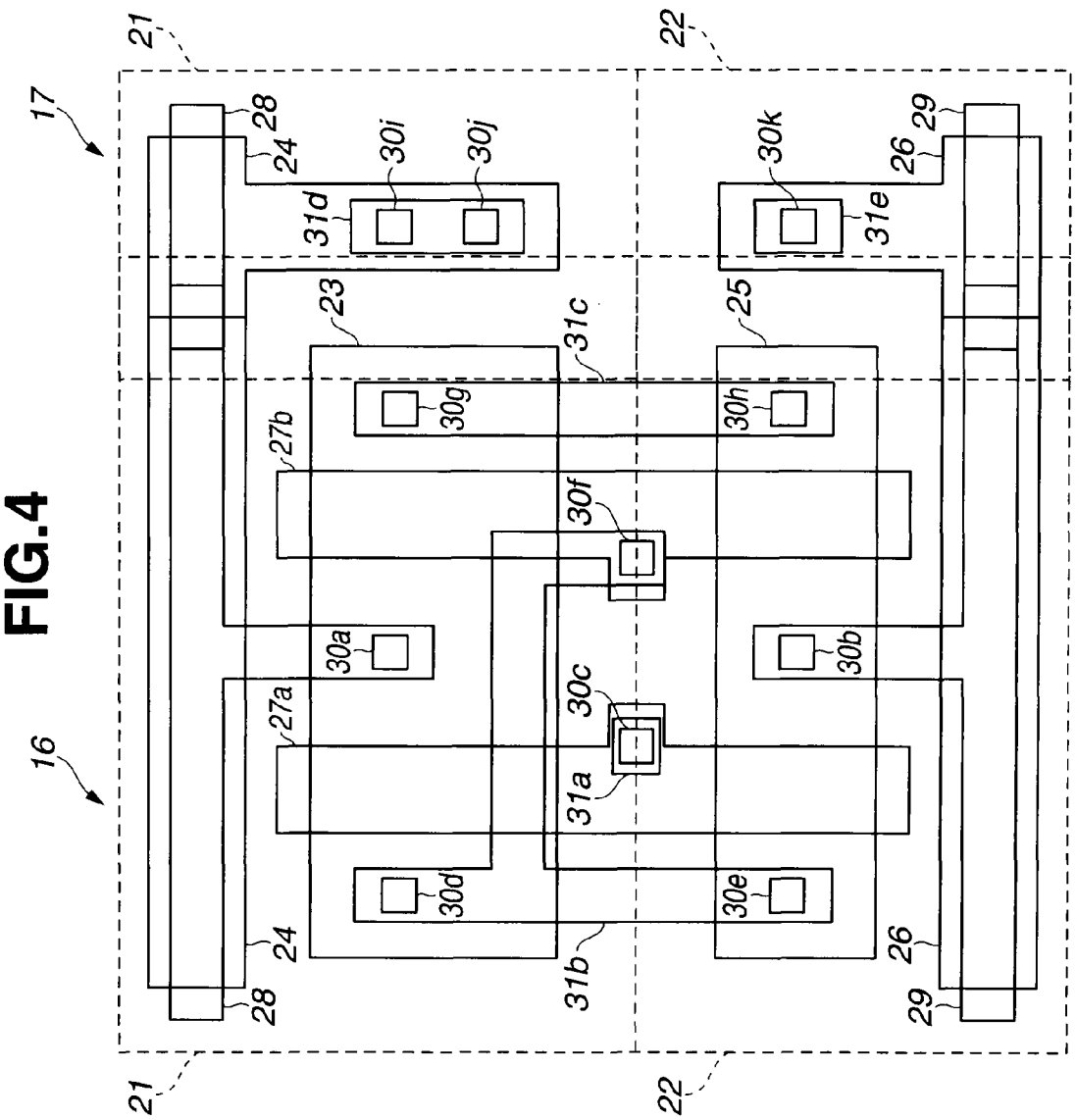
FIG. 4 is a plan view illustrating an exemplary structure in which a substrate contact cell is disposed contiguously to one end of a standard cell.

A structure will be described here in which substrate contact cell 17 is disposed contiguously to one of both ends of a standard cell 16. FIG. 4 is a plan view illustrating a structure in which a substrate contact cell is disposed contiguously to one of both ends of a standard cell.

When the substrate contact cell 17 is disposed contiguously to one of both ends of the standard cell 16, just one substrate contact cell 17 adjoins the one end of the standard cell 16 as shown in FIG. 4. In FIG. 4, the substrate contact cell 17 adjoins the right end of the standard cell 16.

By disposing one substrate contact cell 17 contiguously to one of both ends of a standard cell 16 in this way, an N-well guard ring 24 is shard by the standard cell 16 and the substrate contact cell 17 and a substrate bias potential is also be provided to the N-well 21 of the standard cell 16 through the N-well guard ring 24. Similarly, a P-well guard ring 26 is shard by the standard cell 16 and the substrate contact cell 17 and a substrate bias potential can also be provided to the P-well 22 of the standard cell 16 through the P-well guard ring 26. Consequently, substrate bias control for the standard cell 16 can be performed.

Figure 5:
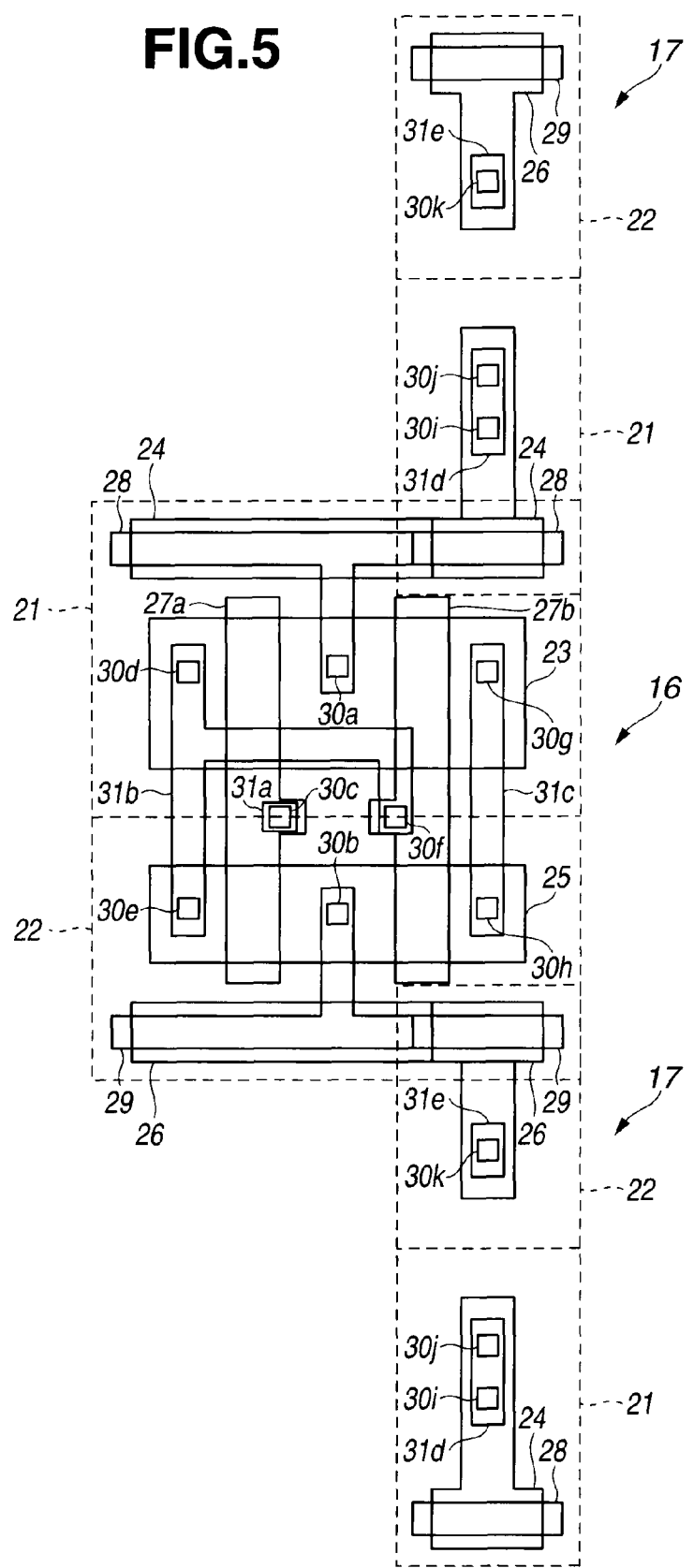
FIG. 5 is a plan view illustrating an exemplary structure in which a substrate contact cell is disposed contiguously to each end of a standard cell.

Another structure will be described next in which a substrate contact cell 17 is disposed contiguously to each of both ends of a standard cell 16. FIG. 5 is a plan view illustrating an exemplary structure in which a substrate contact cell is disposed contiguously to each of both ends of a standard cell.

As shown in FIG. 5, when a substrate contact cell 17 is disposed contiguously to each of the both ends of a standard cell one of the substrate contact cells 17 adjoins the upper end of the standard cell 16 and the other substrate contact cell 17 adjoins the lower end when viewed from above FIG. 5. The substrate contact cell 17 shown in FIG. 3 is turned upside down and disposed contiguously to each of the upper and lower end of the standard cell 16.

By disposing substrate contact cells 17 contiguously to a standard cell 16, one at each end of the standard cell 16, in this way, an N-well guard ring 24 can be shard by the standard cell 16 and one of the substrate contact cells 17. Accordingly, a substrate bias potential is also provided to the N-well 21 of the standard cell 16 through the N-well guard ring 24. Similarly, a common P-well guard ring 26 is shared by the standard cell 16 and the other substrate contact cell 17. Accordingly, a substrate bias potential is also provided to the P-well 22 of the standard cell 16 through the P-well guard ring 26. Consequently, substrate bias control for the standard cell 16 can be performed.

Substrate contact cells 17 having one of the N-well 21 and P-well 22 may be provided. That is, one substrate contact cell is configured with an N-well 21, and N-well guard ring 24, a power supply line 28, a contact 30i, and a wiring layer 31d. Another substrate contact cell is configured with a P-well 22, a P-well guard ring 26, a ground line 29, a contact 30j, and a wiring layer 31e. When substrate contact cells 17 are to be disposed contiguously to a standard cell 16, one at each end of the standard cell 16, the P-well 22 of the substrate contact cell 17 to be disposed at the upper end of the standard cell 16 can be eliminated. Similarly, the N-well 21 of the substrate contact cell 17 to be disposed at the lower end of the standard cell 16 can be eliminated.

As has been described, in the semiconductor device 1, standard cells 16 are provided along a single line in wiring regions 18a, 18b and substrate contact cell or cells 17 are disposed contiguously to each standard cell 16 in the direction parallel to the wiring direction of the signal line in order to provide a substrate bias potential to the associated standard cell 16. In a region where the signal line is disposed horizontally, one substrate contact cell 17 is disposed at one of the both ends of a standard cell 16, that is, at one of the right or left end of the standard cell 16. In a region where the signal line is disposed vertically, one substrate contact cell 17 is disposed at each of the both ends of a standard cell 16, that is, at each of the upper and lower ends of the standard cell 16. Consequently, in the semiconductor device of the present embodiment, unlike in the related-art semiconductor device, substrate contact cells 17 are avoided from being densely disposed in regions between sparsely disposed standard cells 16 and therefore space for disposing signal lines can be provided and, at the same time substrate bias control can be achieved.

In conclusion, the semiconductor device according to the present embodiment, substrate bias control can be performed while providing space for signal lines even when cells are disposed in narrow regions between an input/output unit and a functional block and between functional blocks.

Second Embodiment

A second embodiment will be described below.

Figure 6:
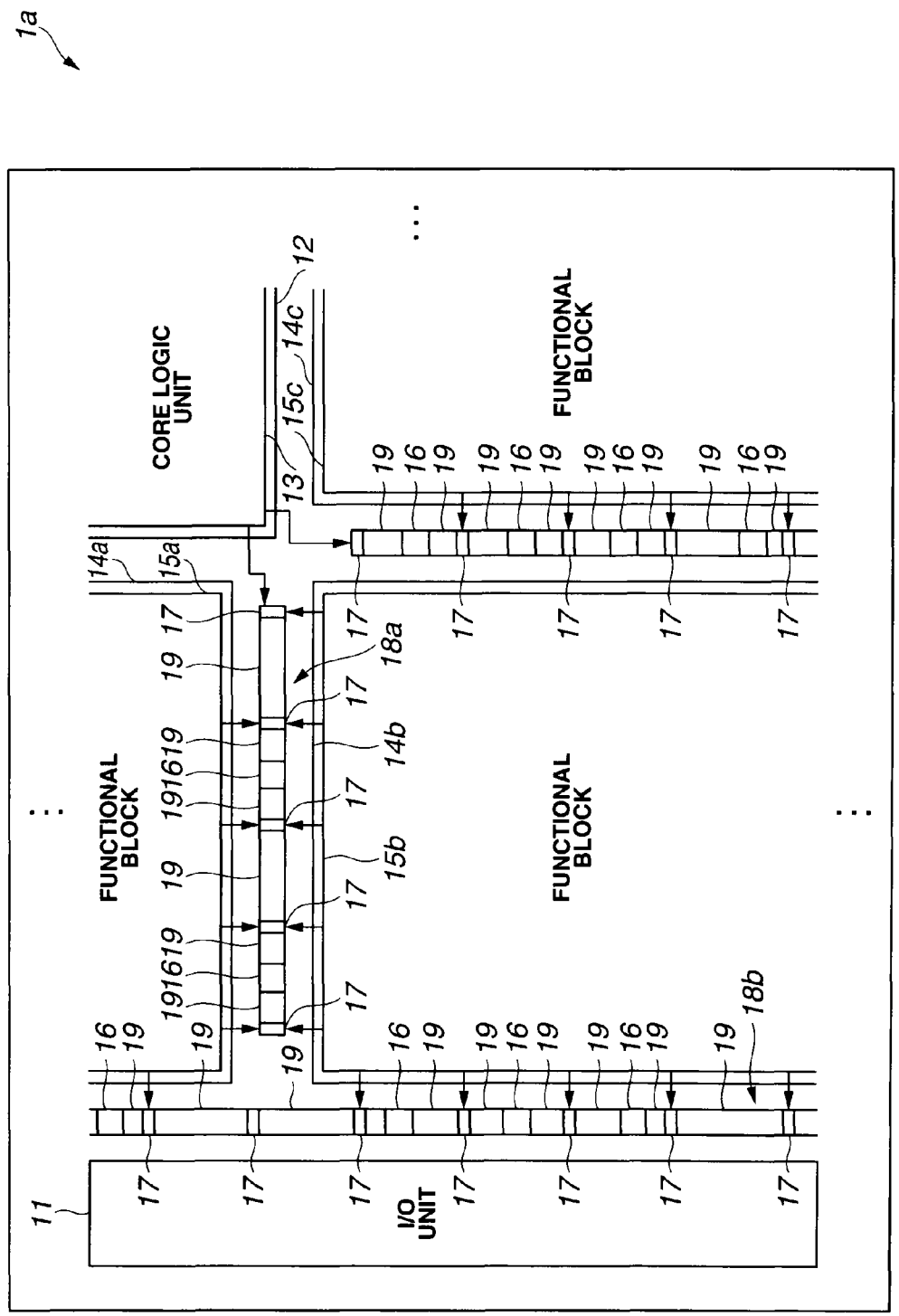
FIG. 6 is a plan view of a semiconductor device according to a second embodiment.

FIG. 6 is a plan of semiconductor device according to a second embodiment. The components in FIG. 6 that are the same as those shown in FIG. 1 are labeled the same reference numerals and the description of which will be omitted. As shown in FIG. 6, in the semiconductor device 1a according to the present embodiment, substrate contact cells 17 are disposed at predetermined regular intervals in wiring regions 18a, 18b and standard cells 16 are sparsely disposed between the substrate contact cells 17. A filler cell 19 is interposed between a standard cell 16 and a substrate contract cell 17 or between substrate contact cells 17, in parallel to a signal line.

The standard cells 16 and substrate contact cells 17 in a region where the signal line is disposed horizontal are disposed in a predetermined direction. The standard cells 16 and substrate contact cells 17 in a region where the signal line is disposed vertically are disposed in a direction at an angle of 90 degrees to the predetermined direction.

A substrate bias line is directly connected to substrate contact cells 17 from substrate bias line 13 around the core logic unit 12, a substrate bias line 15a, 15b, or 15c around a functional block 14a, 14b, or 14c.

The filler cell 19 is used for filling the space between a standard cell 16 and a substrate contact cell 17 or the space between substrate contact cells 17. In the wiring regions 18a, 18b, a filler cell 19 is interposed between a standard cell 16 and one of substrate contact cells 17 disposed at predetermined intervals. A filler cell 19 is also interposed between substrate contact cells 17. In the present embodiment, a standard cell 16 and a substrate contact cell 17 are not necessarily contiguous to each other. Therefore, a substrate bias potential provided to a substrate contact cell 17 is provided to a standard cell 16 through a filler cell 19.

FIG. 7 is a plan view illustrating an exemplary structure of a filler cell. The filler cell 19 is used for filling the space between a standard cell 16 and a substrate contact cell 17 or between substrate contact cells 17.

As shown in FIG. 7, in the filler cell 19, an N-well 21 and a P-well 22 are formed and structured on a semiconductor substrate. A diffusion layer 23 of a PMOS transistor and an N-well guard ring 24 are formed in the N-well 21. A diffusion layer 25 of an NMOS transistor and a P-well guard ring 26 are formed in the P-well 22.

Gates 27a and 27b are formed above the diffusion layer 23 of the PMOS transistor and the diffusion layer 25 of the NMOS transistor, respectively.

A power supply line 28 is formed above the N-well guard ring 24 and a ground line 29 is formed above the P-well guard ring 26.

In a location where a standard cell 16 and a substrate contact call 17 are not contiguous to each other, a filler cell 19 is interposed between the standard cell 16 and the substrate contact cell 17. With this configuration, and N-well guard ring 24 and P-well guard ring 26 can be shared by a standard cell 16 and a filler cell 19. Similarly, N-well guard ring 24 and P-well guard ring 26 can be shard by a substrate contact cell 17 and a filler cell 19. Consequently, a substrate bias potential provided to the substrate contact cell 17 is provided to the standard cell 16, which acts as a repeater, through the filler cell 19. That is, the substrate bias potential for the standard cell 16 can be controlled. The structure of the filler cell 19 is not limited to the one described above. The filler cell 19 may have any structure that includes at least an N-well 21 and a P-well 22.

As has been described, in a wiring region 18a, 18b or the semiconductor device 1a where a signal line is disposed horizontally, a standard cell 16 and a substrate contact cell 17 are disposed along a predetermined direction, and in a wiring region 18a, 18b where a signal line is disposed vertically, a standard cell 16 and a substrate contact cell 17 are disposed along a direction at 90 degrees to the predetermined direction. Consequently, signal wiring regions can be provided and substrate bias control can be performed without disposing two substrate contact cells 17 contiguously to one standard cell 16.

In conclusion, in the semiconductor device according to the present embodiment, substrate bias control can be performed while providing space for signal lines even when cells are disposed in narrow regions between an input/output unit and a functional block and between functional blocks.

The present invention is not limited to the embodiments described above. Various changes and modifications can be made without departing from the spirit of the present invention.

What is claimed is:

1. A semiconductor device having substrate bias control capability, comprising:
    a plurality of functional blocks formed on a substrate, each having a predetermined function;
    a wiring region between functional blocks, a wiring region between each of the functional blocks and an input/output unit, and a wiring region between each of the functional blocks and a core logic unit on the substrate, in each of which a signal line is provided;
    a plurality of logic circuits formed on the substrate, disposed in the wiring regions, and provided along the signal line, each of the plurality of logic circuits operating with a substrate bias potential; and
    a plurality of contact sections formed on the substrate, disposed in the wiring regions in parallel with a wiring direction of the signal line, each being associated with each of the plurality of logic circuits for providing the substrate bias potential to the associated logic circuit, wherein
    each of the logic circuits includes a first well region of a first type and a first well region of a second type, and each of the plurality of contact sections includes a second well region of the first type and a second well region of the second type.

2. The semiconductor device according to claim 1, wherein each of the logic circuits and the contact section associated with the logic circuit are disposed contiguously to each other.

3. The semiconductor device according to claim 2, wherein the wiring direction of the signal line includes a first wiring direction and a second wiring direction orthogonal to the first wiring direction; and
    one contact section is disposed at one of both ends of each of the logic circuits in the first wiring direction, and one contact section is disposed at each of both ends of each of the logic circuits in the second wiring direction.

4. The semiconductor device according to claim 1, wherein the substrate bias potential is provided from each of the functional blocks being substrate-isolated or from the core logic unit being substrate-isolated.

5. The semiconductor device according to claim 1, wherein each of the logic circuits and the contact section associated with the logic circuit are disposed contiguously to each other in such a manner that the first well region of the first type and the second well region of the first type are one common well region of the first type shared by the logic circuit and the contact section and the first well region of the second type and the second well region of the second type are one common well region of the second type shared by the logic circuit and the contact section.

6. The semiconductor device according to claim 5, wherein the wiring direction of the signal line includes a first wiring direction and a second wiring direction orthogonal to the first wiring direction; and
    one contact section is disposed at one of both ends of each of the logic circuits in the first wiring direction, and one contact section is disposed at each of both ends of each of the logic circuits in the second wiring direction.

7. The semiconductor device according to claim 6, wherein:
    each of the contact sections includes the second well region of the first type and the second well region of the second type which are isolated from each other; and
    when the contact sections are disposed at both ends of the logic circuit, one at each end, the second well region of the first type isolated is disposed at one end of the logic circuit and the second well region of the second type isolated is disposed at the other end of the logic circuit.

8. A semiconductor device having substrate bias control capability, comprising:
    a plurality of functional blocks formed on a substrate, each having a predetermined function;
    a wiring region between functional blocks, a wiring region between each of the functional blocks and an input/output unit, and a wiring region between each of the functional blocks and a core logic unit on the substrate, in each of which a signal line is provided;
    a plurality of logic circuits formed on the substrate, disposed in the wiring regions, and provided along the signal line, each of the plurality of logic circuits operating with a substrate bias potential;
    a plurality of contact sections formed on the substrate, disposed in the wiring regions in parallel with a wiring direction of the signal line, each being associated with each of the plurality of logic circuits for providing the substrate bias potential to the associated logic circuit; and a filler cell filling an unoccupied region between each of the logic circuits and the contact section associated with the logic circuit,
wherein the filler cell is formed on the substrate, is disposed in the wiring region in parallel with the wiring direction of the signal line, and provides a substrate bias potential provided to each of the contact sections to the associated logic circuit.

9. The semiconductor device according to claim 8, wherein the filler cell includes a third well region of the first type and a third well region of the second type.

10. The semiconductor device according to claim 9, wherein:
when the filler cell is disposed contiguously to one of the logic circuit, the filler cell is disposed in such a manner that the first well region of the first type and the third well region of the first type are one common well region of the first type shared by the filler cell and the logic circuit and the first well region of the second type and the third well region of the second type are one common well region of the second type shared by the filler cell and the logic circuit; and
when the filler cell is disposed contiguously to one of he contact sections, the filler cell is disposed in such a manner that the second well region of the first type and the third well region of the first type are one common well region of the first type shared by the filler cell and the contact section and the second well region of the second type and the third well region of the second type are one common well region of the second type shared by he filler cell and the contact section.

11. A semiconductor device having substrate bias control capability, comprising:
a plurality of functional blocks formed on a substrate, each having a predetermined function;
a wiring region between functional blocks, a wiring region between each of the functional blocks and an input/output unit, and a wiring region between each of the functional blocks and a core logic unit on the substrate, in each of which a signal line is provided;
a plurality of buffer circuits formed on the substrate, disposed in the wiring regions and provided along the signal line, each of the plurality of buffer circuits operating with a substrate bias potential; and
a plurality of contact sections formed on the substrate, disposed in the wiring regions in parallel with a wiring direction of the signal line, each being associated with each of the plurality of buffer circuits for providing the substrate bias potential to the associated buffer circuit, wherein
each of the buffer circuits includes a first well region of a first type and a first well region of a second type, and each of the plurality of contact sections includes a second well region of the first type and a second well region of the second type.

12. The semiconductor device according to claim 11, wherein each of the buffer circuits shapes a signal waveform distorted by wiring.

13. The semiconductor device according to claim 11, wherein each of the buffer circuits and the contact section associated with the buffer circuit are disposed contiguously to each other.

14. The semiconductor device according to claim 13, wherein the wiring direction of the signal line includes a first wiring direction and a second wiring direction orthogonal to the first wiring direction; and
one contact section is disposed at one of both ends of each of the buffer circuits in the first wiring direction, and one contact section is disposed at each of both ends of each of the buffer circuits in the second wiring direction.

15. The semiconductor device according to claim 11, wherein the substrate bias potential is provided from each of the functional blocks being substrate-isolated or from the core logic unit being substrate-isolated.

16. The semiconductor deice according to claim 11, wherein each of the buffer circuits and the contact section associated with the buffer circuit are disposed contiguously to each other in such a manner that the first well region of the first type and the second well region of the first type are one well region of the first type shared by the buffer circuit and the contact section and the first well region of the second type and the second well region of the second type are one well region of the second type shared by the buffer circuit and the contact section.

17. The semiconductor device according to claim 16, wherein the wiring direction of the signal line includes a first wiring direction and a second wiring direction orthogonal to the first wiring direction; and
one contact section is disposed at one of both ends of each of the buffer circuits in the first wiring direction, and one contact section is disposed at each of both ends of each of the buffer circuits in the second wiring direction.

18. The semiconductor device according to claim 17, wherein
each of the contact sections includes the second well region of the first type and the second well region of the second type which are isolated from each other; and
when the contact sections are disposed at both ends of the buffer circuit, one at each end, the second well region of the first type isolated is disposed at one end of the buffer circuit and the second well region of the second type isolated is disposed at the other end of the buffer circuit.

* * * * *

UNITED STATES PATENT AND TRADEMARK OFFICE
CERTIFICATE OF CORRECTION

| | | |
|---|---|---|
| PATENT NO. | : 7,808,280 B2 | |
| APPLICATION NO. | : 12/472744 | |
| DATED | : October 5, 2010 | |
| INVENTOR(S) | : Takeshi Miyaba | |

It is certified that error appears in the above-identified patent and that said Letters Patent is hereby corrected as shown below:

On the title page, Item (30), the Foreign Application Priority Data is incorrect. Item (30) should read:

-- (30)  Foreign Application Priority Data

May 28, 2008  (JP) ............................ 2008-139823 --

Signed and Sealed this
Eighteenth Day of January, 2011

David J. Kappos
*Director of the United States Patent and Trademark Office*